United States Patent
Ting et al.

(10) Patent No.: US 6,309,977 B1
(45) Date of Patent: Oct. 30, 2001

(54) METHOD FOR THE ETCHBACK OF A CONDUCTIVE MATERIAL

(75) Inventors: Chris Ting, Taoyuan; Janet Yu, Changhaw, both of (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/499,501

(22) Filed: Feb. 7, 2000

(30) Foreign Application Priority Data

Feb. 10, 1999 (TW) .............................. 088102104

(51) Int. Cl.[7] .................................. H01L 21/302
(52) U.S. Cl. .................... 438/706; 438/715; 438/716; 438/720
(58) Field of Search .................... 438/706, 720, 438/715, 716

(56) References Cited

U.S. PATENT DOCUMENTS

| | | | |
|---|---|---|---|
| 5,286,675 | * | 2/1994 | Chen et al. ............................ 437/195 |
| 5,552,340 | * | 9/1996 | Lee et al. ............................. 437/190 |
| 5,591,672 | * | 1/1997 | Lee et al. ............................. 437/190 |
| 5,641,710 | * | 6/1997 | Wang et al. .......................... 438/643 |
| 5,705,442 | * | 1/1998 | Yen et al. ............................. 438/653 |
| 5,843,839 | * | 12/1998 | Ng ....................................... 438/637 |

OTHER PUBLICATIONS

I. Miller et al., "Tungsten Etch Technology for Submicron Devices", Advanced Metallization for ULSI Applications Proceedings of Conference, pp. 463–469 (1992).*

* cited by examiner

*Primary Examiner*—Benjamin L. Utech
*Assistant Examiner*—Charlotte A. Brown
(74) *Attorney, Agent, or Firm*—Shirley L. Church (57) ABSTRACT

The present disclosure provides a method for etchback of a conductive layer in a contact via (contact hole). The method described is typically used in the formation of a conductive plug within the contact hole. The method includes a first etchback in which the conductive layer is etched back; a buffer (i.e., transition) step during which the etch rate of the conductive layer is reduced; and a second etchback in which the amount of chemically reactive etchant is reduced from that used in the first etchback and a plasma species is added to provide additional physical bombardment, in an isotropic etch of the substrate surface surrounding the contact hole.

25 Claims, 6 Drawing Sheets

METHOD FOR THE ETCHBACK OF A CONDUCTIVE MATERIAL

FIELD OF THE INVENTION

The present invention pertains to a method for forming interconnections on semiconductor integrated circuit chips. In particular, the present invention pertains to a method for the etchback of a conductive material during a semiconductor manufacturing process.

BRIEF DESCRIPTION OF THE BACKGROUND ART

Since the development of the first integrated circuit device, the technology of semiconductor fabrication has focused on minimizing the feature size of semiconductor devices. With the advancements made in processing technologies such as deposition, lithography, etching, and thermal treatment, the packing density of integrated circuit chips has greatly increased. A single chip manufactured using the present semiconductor fabrication technology may include millions or even billions of devices such as transistors and capacitors. To accomplish this, the feature size of integrated circuit devices has been scaled down to a submicron level.

When semiconductor devices are densely arranged on an integrated circuit chip, the conductive interconnections between such devices must be scaled down accordingly. All of the conductive pathways (typically, polysilicon or metal connections) between devices must be scaled down in width, without degrading the operating characteristics of the integrated circuit. When used to connect submicron size devices, the interconnections must provide defect-free contact between conducting and connecting members.

Figure 1:
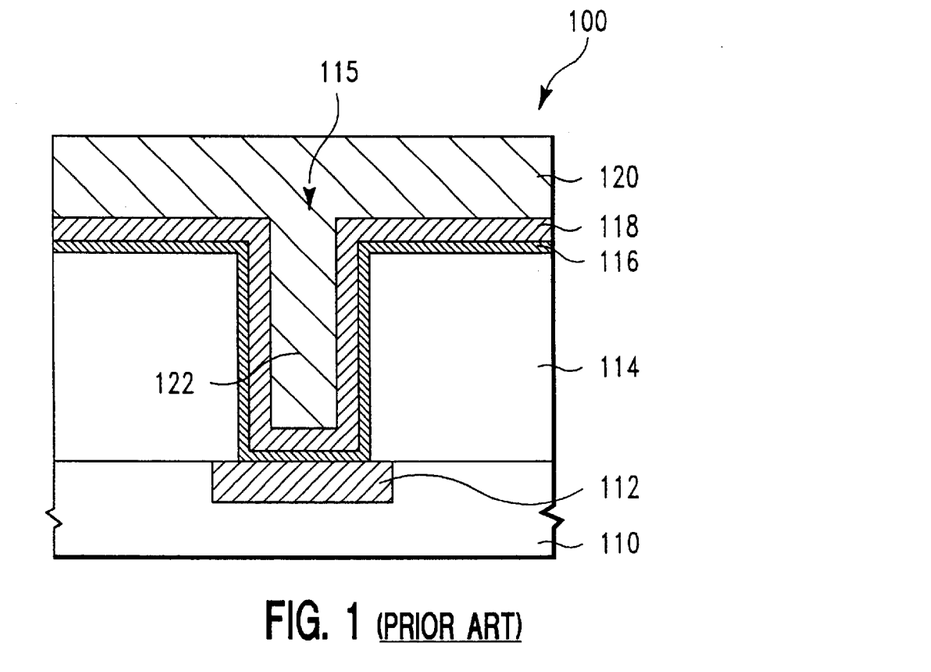
FIG. 1 is a cross-sectional view of a prior art semiconductor structure 100, including a semiconductor substrate 110 with a conductive region 112 to be electrically connected within a device. A dielectric layer 114 is formed over the substrate 110 and is etched to provide a contact hole 115 therein. The following layers are deposited, from bottom to top, within the contact hole 115: a wetting layer 116, a diffusion barrier layer 118, and a conductive material layer 120.

The interconnections on integrated circuit chips are generally constructed to have several layers of metal pathways. With the increased packing density of modern semiconductor chips, three or more layers of metal connections are commonly used for constructing the entire circuit. The connections between metal layers and underlying conductive regions of polysilicon are provided by means of conductive plugs. FIG. 1 shows a semiconductor structure 100 which includes a semiconductor substrate 110 having a conductive region 112 to be electrically connected with other conductive regions in structure 100. A dielectric layer 114 is formed over the substrate 110 and subsequently pattern etched to define a contact hole 115 therein. After the deposition of a conductive wetting layer 116 and a conductive diffusion barrier layer 118, a filling layer 120 of a conductive material is deposited into the contact hole 115 for the purpose of forming a contact plug 122, which provides an electrical connection to conductive region 112.

Figure 2:
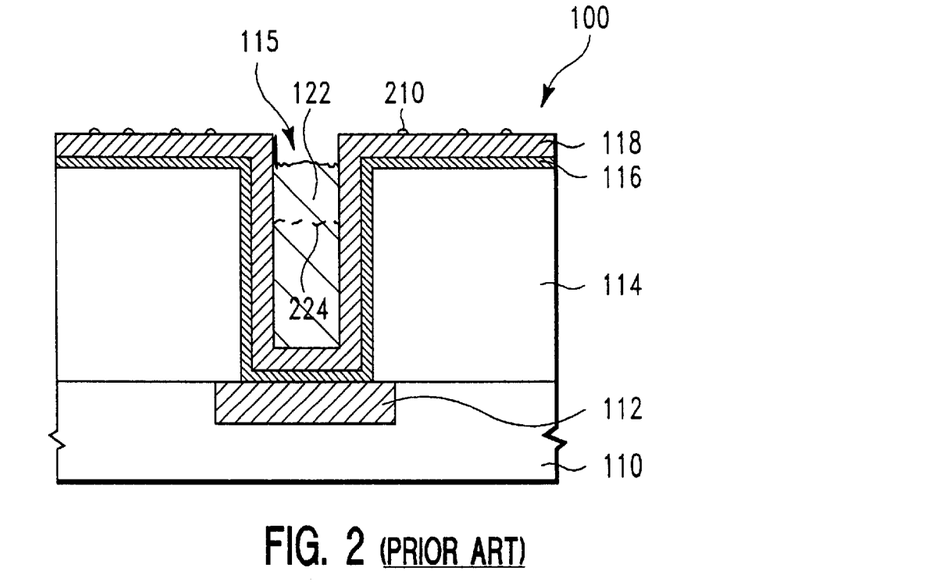
FIG. 2 shows the structure 100 of FIG. 1 after etchback of the conductive material layer 120 using a prior art etchback process, which typically results in undesirable conductive residues 210 and/or a shortened contact plug having a surface 224.

As shown in FIG. 2, the filling layer 120 is then etched back so that the contact plug remains in the contact hole 115 for the purpose of making a conductive connection with an overlying metal layer deposited in a subsequent processing step. Ideally, the filling layer 120 is etched back until the portion of conductive material outside the contact hole 115 is removed and the portion inside the contact hole 115 remains (i.e., the top surface of the portion of the filling layer remaining within the contact hole is even with the top surface of the dielectric layer 114).

A conventional method of filling a contact hole is to deposit a layer of metal over dielectric layer 114 and then to etchback the metal layer to create a "plug" in the hole. For example, and not by way of limitation, the metal may be tungsten, aluminum, aluminum-copper, aluminum-silicon-copper, or aluminum-silicon. Regardless of the conductive material used, it is difficult to control the etchback process so that the conductive residue is completely removed from the upper surface of the dielectric layer, while leaving the contact hole completely filled with conductive material. If the etchback process is performed until the conductive residues 210 (shown in FIG. 2) are completely removed, plug loss is found to result in a shortened contact plug 224. By contrast, an etchback process without plug loss may result in a significant amount of residue remaining outside the contact hole. The remaining residues 210 may create undesired current leakage or short-circuiting problems in the final product.

In their paper entitled "Tungsten Etch Technology for Submicron Devices" (Advanced Metallization for ULSI Applications Proceedings of Conference, pp. 463–469, 1992), Ivo Miller et al. disclosed the above problem in a tungsten etchback process. Miller et al. describe that, in a blanket deposition/etchback scheme, the primary objective is to leave a via or contact completely filled with tungsten. However, the problem of microloading (a change in the local etch rate relative to the location of the material being etched on the substrate) is of paramount importance, and the paper presents detailed descriptions of a method for reducing the microloading effect. Extensive work was performed in an attempt to minimize the effect of microloading by introducing polymerizing chemistries at endpoint and by reducing etchant concentration. However, Miller et al. point out that these approaches also have an impact on system cleanliness and on wafer throughput. Miller et al. developed and characterized a fluorine-based tungsten etchback process for a single wafer plasma etch system. The effects of temperature on the microloading effect and on the etch selectivity toward tungsten relative to titanium nitride were evaluated and summarized. Although the mechanism was not discussed in detail, Miller et al. found that control of the processing temperature assists in controlling tungsten plug loss and tungsten: titanium nitride etch selectivity. Miller et al. proposed a method for controlling the microloading effect and the tungsten to titanium nitride etch selectivity using a reduced processing temperature, allowing optimum process latitude without excessive tungsten plug or titanium nitride barrier layer loss.

U.S. Pat. No. 5,641,710, issued Jun. 24, 1997, to Wang et al., discloses a tungsten etchback process with an accompanying annealing process. A post-reactive ion etch (RIE) anneal is performed in a nitrogen ambient to remove moisture from the surrounding dielectric layers of plugs and also to form a protective, nitrogen-containing tungsten layer to fill the crevice in the tungsten plug. However, Wang et al. does not address the plug loss problem in tungsten etchback processes.

SUMMARY OF THE INVENTION

The present invention relates to a method of reducing or eliminating the problem of plug loss during the etchback of a conductive plug, while simultaneously enabling the removal of residual conductive material present on adjacent surfaces after deposition of the conductive plug. The method leaves essentially undisturbed conductive material residing in a cavity within the substrate, while the conductive material is removed from the substrate surface (despite the presence of an opening to the cavity from the surface of the substrate).

A typical beginning structure for performing the method of the invention comprises a substrate containing a number of cavities, such as contact vias, and may also contain interconnect trenches. Blanket deposition of a conductive material over the substrate fills the cavities and leaves a continuous layer of conductive material over the substrate surface. The conductive material may be tungsten, or another metal such as aluminum-copper, aluminum-silicon-copper, or aluminum silicon, by way of example and not by way of limitation.

In a preferred embodiment method of the invention, the conductive material is tungsten. Typically, the tungsten is not deposited directly upon a dielectric layer surface. Rather, the dielectric layer surface, including openings and cavities within the dielectric layer, is first covered with a wetting layer, such as, for example, titanium, followed by a diffusion barrier layer, such as, for example, titanium nitride, followed by deposition of tungsten.

According to the method of the invention, a first, rapid etchback process is typically performed, using a fluorine-comprising etch techniques known in the art known to provide a good etch rate, for the purpose of removing most of the conductive material from the surface of the substrate. For example, and not by way of limitation, the first etchback step may be performed using a plasma generated from a fluorine-comprising gas (preferably, $SF_6$) and argon. The plasma source gas may further contain additional gases such as oxygen or nitrogen (where nitrogen is used to replace at least a portion of the argon). The initial substrate temperature is typically within the range of about 10° C. to about 20° C., and is raised so that it ranges from about 40° C. to about 60° C., during the first etchback step.

Subsequently, a buffer (i.e., transition) step is performed during which either the plasma source power or the substrate bias power, or both, are significantly reduced or discontinued, and the substrate surface temperature is decreased, typically, by at least 10° C., to a temperature of less than about 40° C., for example and not by way of limitation. This enables precise control of the etch rate and alters the selectivity so that the etch rate of tungsten is reduced relative to the adjacent diffusion barrier of titanium nitride. As an example, and not by way of limitation, the substrate bias power may be reduced to 50% or less of the substrate bias power used in the first etchback step. Alternatively, both the plasma source power and the substrate bias power may be turned off during the performance of the buffer step. If necessary, the substrate support electrode on which the substrate rests may be cooled so that the substrate temperature will fall within the desired temperature range.

A second etchback step is then performed to remove residual conductive material from the substrate surface, while leaving essentially undisturbed conductive material residing in the cavities. The second etchback step is conducted using a modified etch chemistry, where the flow rate of the fluorine-comprising gas is preferably reduced by about 50%, and the flow rate of argon is preferably doubled, relative to the flow rates used in the first etch step. During the performance of the second etchback step, the substrate temperature is typically maintained at the reduced temperature achieved in the buffer step, for example, at a temperature of less than about 40° C. If necessary, the substrate may be cooled by cooling the substrate support pedestal (electrode) upon which the substrate rests. The plasma source power and substrate bias power are preferably increased to at least 50% of that used in the first etch step.

We have discovered that the etching rate of residues located on the substrate surface outside a contact hole (cavity) is less dependent upon temperature than is the etch rate of the plug in the cavity. The residues located outside the contact hole also present more exposed surface area for etching than does the contact plug. The lowering of the substrate temperature in the buffer step reduces the etch rate of the conductive plug, permitting careful etchback to the desired plug depth during the second etch step. By leaving the temperature reduced from the buffer step and increasing the amount of ion bombardment of the exposed surface during the second etchback step, it is possible to remove residues from the substrate surface while leaving the plug surface relatively undisturbed. Preferably the ion bombardment is isotropic ion bombardment.

The present invention provides an etchback method which enables the removal of residue of a conductive material from the surface of a substrate, while leaving essentially undisturbed conductive material residing in a cavity within the substrate, despite the presence of an opening to the cavity from the surface of the substrate.

DETAILED DESCRIPTION OF THE PREFERRED EMBODIMENTS

The present invention discloses a method for the etchback of a conductive material layer in a semiconductor structure which reduces or eliminates the plug loss problem encountered using prior art etchback methods. The method includes a first etchback steps a buffer step during which plasma source power or substrate bias power or both are reduced, and a second etchback step in which the amount of chemically reactive etchant is reduced from that used in the first etch step and in the buffer step. Using this three-step process, residues remaining after the first etchback step are removed in the second etchback step without significant plug loss.

I. Definitions

As a preface to the detailed description, it should be noted that, as used in this specification and the appended claims, the singular forms "a", "an", and "the" include plural referents, unless the context clearly dictates otherwise.

Specific terminology of particular importance to the description of the present invention is defined below.

The term "anisotropic etching" refers to etching which does not proceed in all directions at the same rate. If etching proceeds exclusively in one direction (e.g., only vertically), the etching process is said to be completely anisotropic.

The term "bias power" refers to the power applied to the substrate support platen to produce a negative voltage on the substrate surface. Typically, the negative voltage is used to control ion bombardment energy and the directionality of ions toward a substrate.

The term "conductive material" refers to any material which is capable of conducting electrical current, including, without limitation, tungsten, titanium, tantalum, aluminum, and copper.

The term "ion bombardment" refers to, but is not limited to, physical bombardment of a substrate surface by ions (and other excited species of atoms which are present with the ions).

The term "isotropic etching" refers to etching which proceeds in all directions at the same rate.

The term "source power" refers to the power used to generate plasma ions and neutrals, whether directly in an etching chamber or remotely, as in the case of a microwave plasma generator.

II. The Method for Etchback of a Conductive Material

By way of example and not by way of limitation, the method is described with respect to a tungsten etchback process. However, the general concepts taught herein are applicable to other conductive materials, such as aluminum, aluminum-copper, aluminum-copper-silicon, and aluminum-silicon, by way of example and not aby way of elimination. A wide variety of different materials, processing chambers, and processing recipes can be used with the general method of the invention, without being limited to the details in the following description.

The process steps described herein were carried out in a plasma etch chamber available from Applied Materials, Inc. of Santa Clara, Calif. In particular an MXD process chamber was used in a CENTURA® system.

Figure 3:
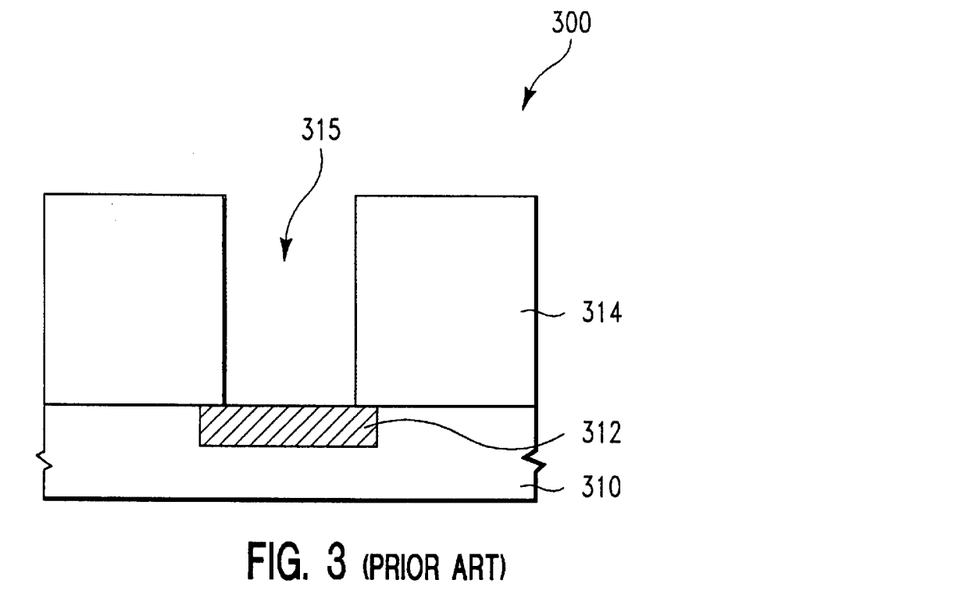
FIG. 3 shows across-sectional view of a beginning structure 300 for practicing the method of the invention. The structure 300 includes a semiconductor substrate 310 with a conductive region 312 to be connected. A dielectric layer 314 is formed over the substrate 310 and is defined with a contact hole 315 therein.

A detailed process for forming a tungsten plug which electrically connects an underlying conductive region and an overlying conductive line or layer is described herein. Referring to FIG. 3, a semiconductor structure 300 is provided which includes a semiconductor substrate 310 having a conductive region 312 for forming extended connections. The semiconductor substrate 310 is typically a single-crystal silicon substrate having <100> crystallographic orientation. Alternatively, other semiconductor substrates or crystallographic orientations can be used. For making extended conductive connections, the conductive region 312 can be a region on an interconnect pathway, such as a metal or polysilicon conductive pathway. Alternatively, the conductive region 312 can be a conductive junction region, such as a source/drain junction region of a transistor on the substrate 310. In order to form connections, the substrate 310 is prepared with most of the operating devices finished, or even with some lower metal layers formed thereon for forming upper layers of connections through plugs.

A dielectric layer 314 is deposited over both the substrate 310 and the conductive region 312. The dielectric layer 314 typically comprises silicon oxide, which is preferably deposited from TEOS (tetraethylorthosilicate) using chemical vapor deposition (CVD) techniques, such as low pressure CVD (LPCVD) or plasma-enhanced CVD (PECVD). The processing temperature is between about 350° C. and about 800° C. The silicon oxide layer is typically deposited to have a thickness within the range of about 3,000 Å to about 8,000 Å. The thickness of the dielectric layer may be adjusted depending on the circuit design and the feature size of the devices.

An etch step is then performed to remove a portion of the dielectric layer 314. A photoresist mask (not shown) with a defined opening is typically used, in combination with lithography processes known in the art, to form a contact hole or via hole 315 in the dielectric layer 314. The contact hole 315 is etched down until a region on the surface of the conductive region 312 is exposed for making contacts. In a preferred embodiment of the invention, plasma etching techniques are used to etch the contact hole 315, in order to provide vertical sidewalls and a high aspect ratio of the etched hole. Plasma etching of the contact hole 315 may be performed using a fluorine-based plasma. The plasma is preferably generated from a source gas composed primarily of $CHF_3$. Alternatively, other fluorocarbon-based etchant gases may be used.

Figure 4:
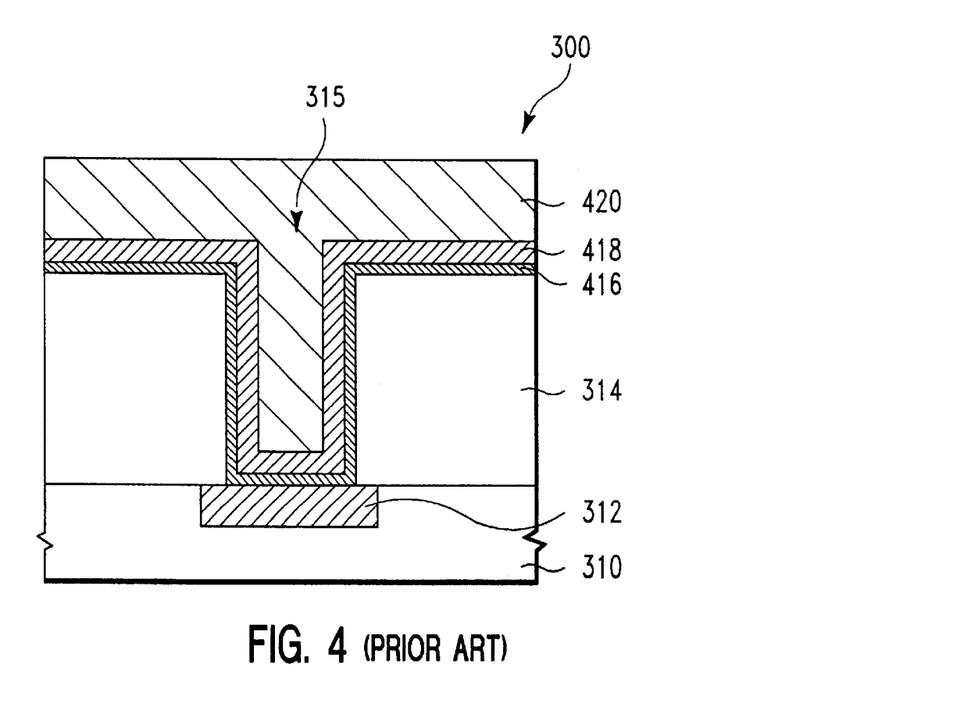
FIG. 4 shows the structure 300 of FIG. 3 after deposition of the following layers, from bottom to top, within the contact hole 315: a wetting layer 416, a diffusion barrier layer 418, and a conductive material layer 420.

Referring to FIG. 4, after formation of the contact hole 315, a wetting layer 416 is deposited on surfaces of the dielectric layer 314, the contact hole 315, and the conductive region 312. The wetting layer 416 is provided in order to enhance the adhesion of a diffusion barrier layer 418 or the conductive layer 420 to the dielectric layer 314, and to reduce the resistance of the combination of materials which comprise the electrical contact (including layers 312, 416, 418, and 420). In a preferred embodiment of the invention, the wetting layer 416 comprises titanium. The titanium layer 416 is typically deposited using a physical vapor deposition (PVD) technique, such as sputter deposition, to have a thickness within the range of about 300 Å to about 500 Å.

A diffusion barrier layer 418 is then deposited over the wetting layer 416 in order to protect neighboring materials from undesired interfacial effects, such as chemical reactions or spiking effects, which could damage the conductivity and operational characteristics of the circuit. A preferred barrier layer 418 for use in combination with a titanium wetting layer 416 comprises titanium nitride. The titanium nitride layer 418 is preferably deposited using a PVD technique, such as sputtering or reactive sputtering, to have a thickness within the range of about 700 Å to about 1500 Å.

Next, a conductive material layer 420 is formed overlying the barrier layer 418, to fill the contact hole 315 and overlie the dielectric layer 314. In order to form plugs or filled-in interconnections, the conductive material layer 420 preferably comprises a metal, more preferably, tungsten or another metal such as aluminum, aluminum-copper, aluminum-silicon-copper, or aluminum-silicon. A CVD or LPCVD process is typically used to deposit the conductive material layer 420 to a thickness within the range of about 3,500 Å to about 8,000 Å, depending on the depth of the contact hole 315.

A first etchback step is then performed in order to etchback the tungsten layer 420, using plasma etch techniques and chemistries known in the art to provide a good etch rate. The tungsten layer 420 is removed from the top surface down to the surface of an underlying layer, such as the barrier layer 418. Typically, a chlorine or fluorine-based plasma is used in the first etchback step. For a tungsten etchback, the first etchback step is preferably performed using a plasma generated from $SF_6$ and a carrier gas, such as argon or nitrogen. The atomic ratio of fluorine to carrier gas is typically within a range of about 6:1 to about 48:1. The plasma source gas may further contain additional gases such as oxygen.

In a preferred embodiment of the invention, when a plasma etch chamber, such as the MXD chamber of the Applied Materials' CENTURA® etch system, is used, $SF_6$ is typically provided at a flow rate within the range of about 80 sccm to about 160 sccm, and argon is typically provided at a flow rate within the range of about 20 sccm to about 80 sccm. Typical process conditions include a process chamber pressure ranging from about 10 mTorr to about 30 mTorr, a plasma source power within the range of about 1000 W to about 2000 W, and a substrate bias power within the range of about 50 W to about 100 W. The initial substrate temperature during the first etchback step is typically within the range of about 10° C. to about 20° C., then is raised to about 40° C. to about 60 ° C. The first etchback step is typically performed for a time period of about one minute.

Figure 5:
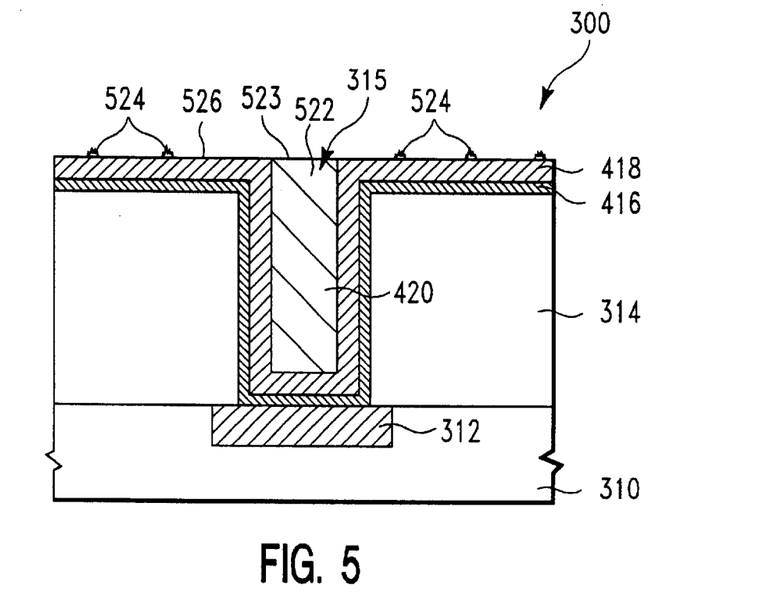
FIG. 5 shows the structure 300 of FIG. 4 after etchback of the conductive material layer 420, according to the first etch step of the invention, to form a conductive plug 522.

Referring to FIG. 5, the first etchback step is performed until most of the tungsten outside of the contact hole 315 has been removed, and the presence of the titanium nitride barrier layer 418 is detected. At this point, a contact plug 522 is left in the contact hole 315. The top 523 of the contact plug 522 is approximately level with the upper surface 526 of the barrier layer 418. Some tungsten residues 524 may remain on areas of the barrier layer surface, but these residues will be removed during the performance of the second etchback step.

After the first etchback step, a buffer (i.e., transition) step is performed in which the temperature of the substrate 310 and overlying layers is reduced. In a preferred embodiment of the invention, the buffer step is effected by reducing the plasma source power and/or the substrate bias power to 50% or less of their initial power, while maintaining the plasma etch chemistry used in the first etchback step. In the most preferred embodiment, the plasma source power and/or the substrate bias power are turned off. During the performance of the buffer step, the plasma source power is typically within the range of 0 W to about 1000 W, and the substrate bias power is typically within the range of about 0 W to about 50 W. The buffer step is typically performed for a time period within the range of several seconds to tens of seconds.

Figure 6:
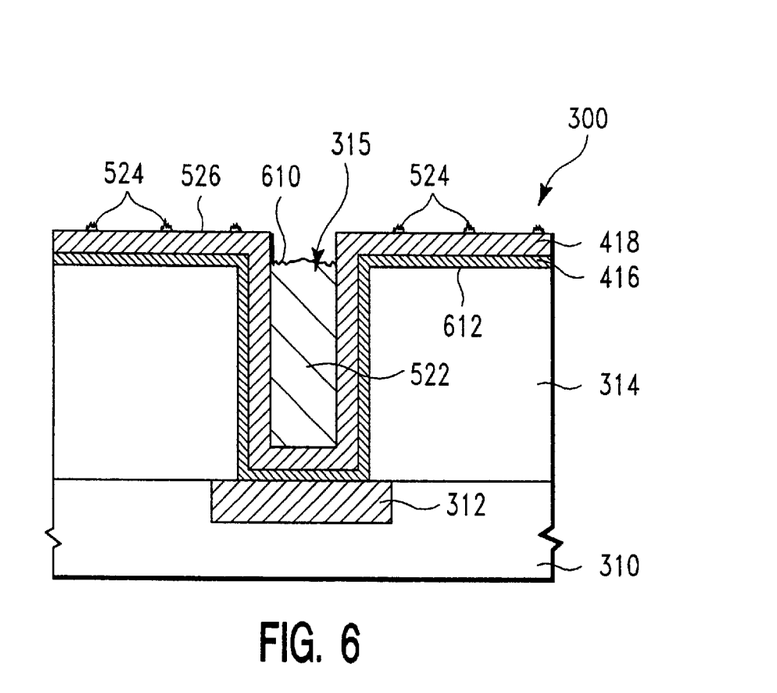
FIG. 6 shows the structure 300 of FIG. 5 after performance of the buffer step of the invention. Some conductive material residues 624 remain on the surface of the barrier layer 418.

The substrate surface temperature is typically reduced by at least 10° C. during the buffer step, to a temperature of less than about 40° C., for example. By reducing the substrate temperature and the plasma source power, the etching of tungsten can be temporarily stopped or slowed, and the selectivity for etching the tungsten plug 522 and residues 524 in the second etchback step can be well-controlled. FIG. 6 shows the structure of FIG. 5 after performance of the buffer step. Some tungsten residues 524 remain on areas of the barrier layer 418 surface 526. The plug 522 surface 523 is typically etched back to a new surface 610 which is approximately at the same level as dielectric 314 surface 612

Figure 7:
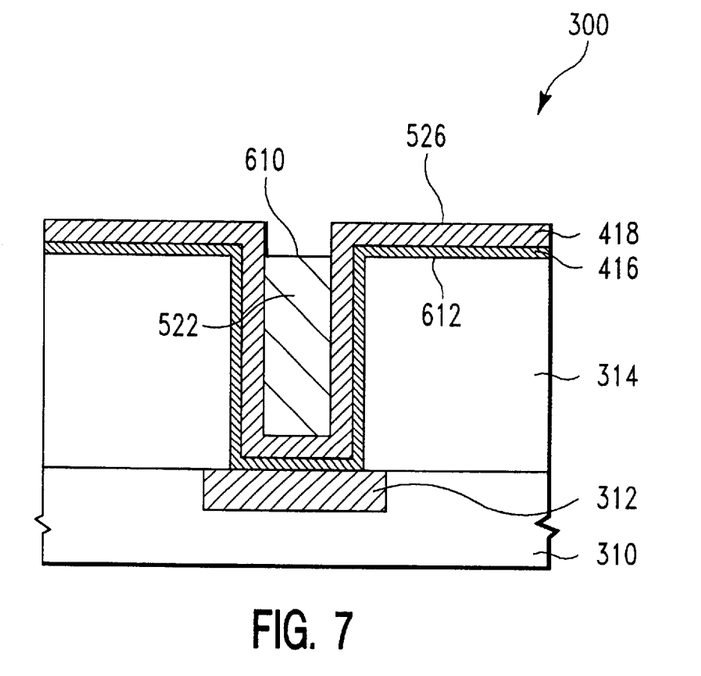
FIG. 7 shows the structure 300 of FIG. 6 after performance of the second etchback step of the invention. The surface 610 of the conductive plug 522 is even with the upper surface 612 of the dielectric layer 314, and all conductive material residues have been removed from the surface of the barrier layer 418.

Referring to FIG. 7, a second etchback step is then performed to remove the remaining tungsten residues 624 (shown in FIG. 6), to leave a tungsten plug 522 without any significant additional etch back (plug loss) in the contact hole 315. The second etchback step is performed using a modified etch chemistry, where the flow rate of $SF_6$ is preferably reduced by about 50%, and the flow rate of argon is preferably doubled, relative to the flow rates used in the first etchback step. The atomic ratio of fluorine:argon is preferably within the range of about 3:2 to about 12:1 during the performance of the second etchback step. The increased argon concentration results in ;increased physical bombardment of the substrate surface, thereby removing tungsten residues 524 remaining on the surface 526 of the barrier layer 418. The decreased fluorine concentration leads to a decreased tungsten etch rate within the conductive plug 522, resulting in minimal plug loss during residue 524 removal. As shown in FIG. 7, the surface 610 of the conductive plug 522 is now approximately even with the upper surface 612 of the dielectric layer 314.

During the performance of the second etchback step, the process chamber pressure typically remains approximately the same as in the first etchback step. The substrate temperature is typically maintained at the reduced temperature achieved in the buffer step, for example, at a temperature of less than about 40° C. When a plasma etch chamber, such as the MXD chamber of the Applied Materials' CENTURA® etch system, is used, the plasma source power is typically within the range of about 500 W to about 1000 W, and the substrate bias power is typically within the range of about 20 W to about 50 W, during the performance of the second etchback step. The low bias power results in isotropic etching of the top surface of the semiconductor structure 300, with minimal bombardment of the conductive plug 522.

Figure 8:
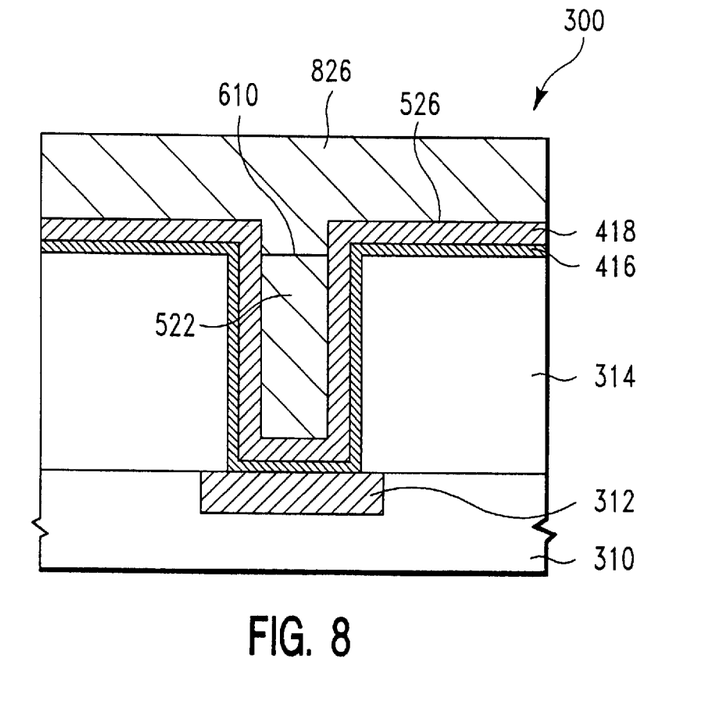
FIG. 8 shows the structure 300 of FIG. 7 after the formation of a conductive layer 826 over the surface of the barrier layer 418 and conductive plug 522. The conductive layer 826 is provided for the purpose of making a conductive connection with the conductive region 312 through the conductive plug 522.

Referring to FIG. 8, a conductive layer 826 may then formed over the barrier layer 418, using techniques known in the art, to make a conductive connection with the conductive region 312 through the conductive plug 522. Subsequently, a planarization step such as chemical-mechanical polishing may be used to provide a planarized surface; however, one of the advantages of the method of the present invention is that due to the reduction in plug 522 loss, such a chemical-mechanical polishing step may not be necessary. The conductive layer 826, in combination with the barrier layer 418 and the wetting layer 416, may be patterned to define conductive paths for subsequent layers of metallization. The conductive layer 826 may comprise an aluminum-based material, such as aluminum-copper-silicon, and is typically deposited using a PVD technique such as sputtering.

Figure 9:
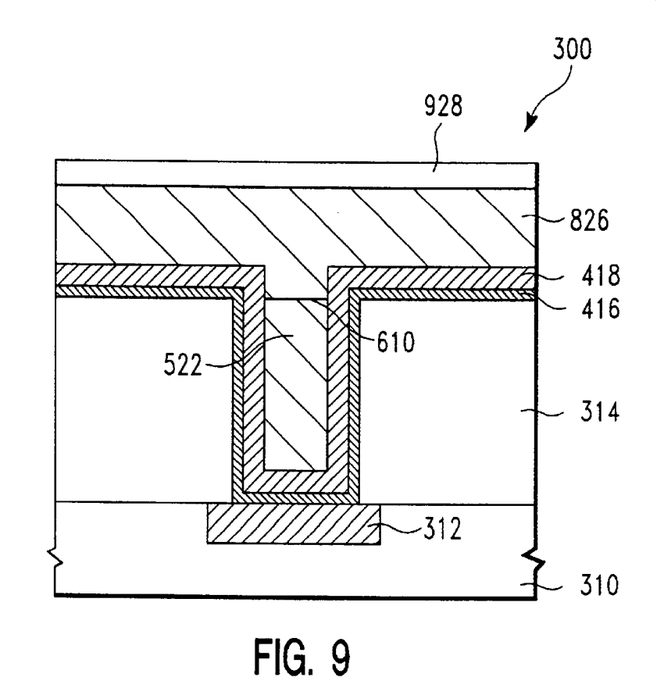
FIG. 9 shows the structure 300 of FIG. 8 after the formation of an anti-reflection coating (ARC) layer 928 over the surface of the conductive layer 826. The ARC layer 928 is provided to improve the accuracy in the pattern-defining lithography process.

Referring to FIG. 9, an anti-reflection coating (ARC) layer 928 may also be formed overlying the conductive layer 826 prior to a patterning step for subsequent metallization. The ARC improves the accuracy in a pattern-defining lithography process.

Figure 10:
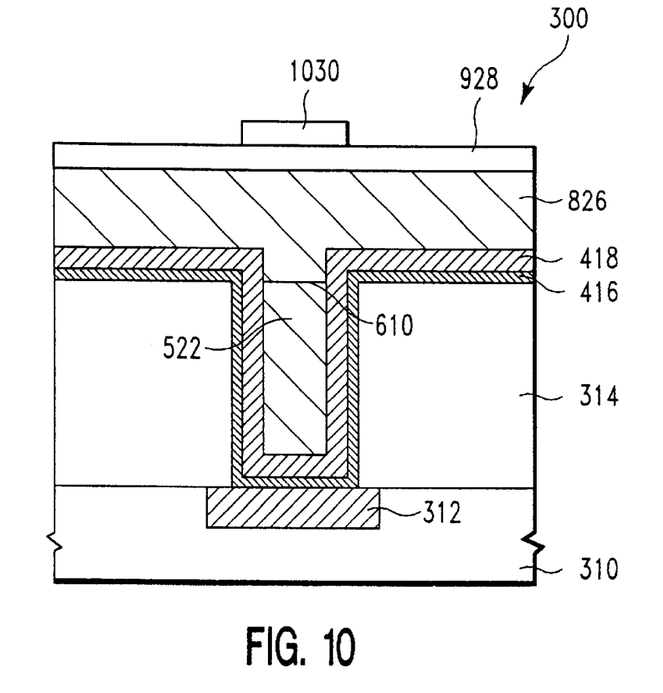
FIG. 10 shows the structure 300 of FIG. 9 after the formation and development of a masking material to provide a patterned masking layer 1030 over the surface of the ARC layer 928.

Referring to FIG. 10, a masking material (such as a photoresist) is applied over the surface of the ARC layer 928 and developed using techniques known in the art to provide a patterned masking layer 1030, defining the areas of the semiconductor structure to be etched.

Figure 11:
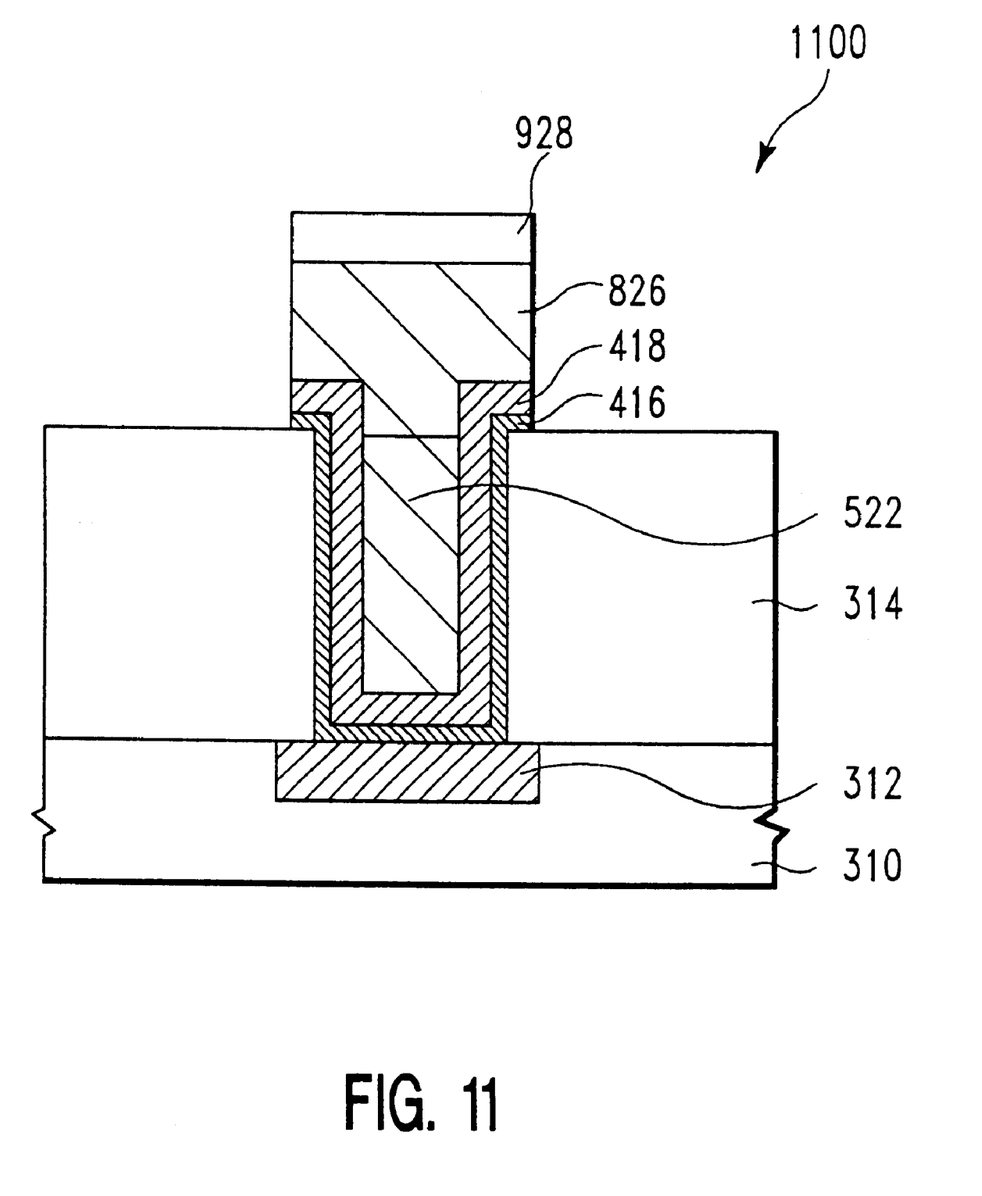
FIG. 11 shows a final semiconductor structure 1100 of the invention after anisotropically etching the structure 300 of FIG. 10 to remove portions of the ARC layer 928, conductive layer 826, barrier layer 418, and wetting layer 416, followed by removal of the masking layer 1030.

Using the patterned masking layer 1030, the ARC layer 928, conductive layer 826, barrier layer 418, and wetting layer 416 are anisotropically etched using techniques known in the art, stopping at the surface of the dielectric layer 314. Any remaining masking layer 1030 may be subsequently removed by techniques known in the art, to provide a structure 1100 of the kind shown in FIG. 11.

Using the etchback method of the invention, the plug loss problem present in prior art etchback processes can be reduced or eliminated. The overlying conductive layer 624 can be deposited with good contact and topography. As a result of using the method of the invention, the conductivity and operational characteristics of integrated circuits are significantly improved. The low yield problem resulting from plug loss in conventional etchback processes is eliminated or reduced as well.

The above-described preferred embodiments are not intended to limit the scope of the present invention, as one skilled in the art can, in view of the present disclosure expand such embodiments to correspond with the subject matter of the invention claimed below.

We claim:

1. A method for etchback of a conductive material layer within a semiconductor structure, wherein said semiconductor structure comprises a substrate including a conductive region to be connected, a dielectric layer formed over said substrate and defined with a contact hole therein which overlies said conductive region, and a conductive layer deposited within said contact hole, wherein said method comprises the steps of:

a) a first etchback to remove a portion of said conductive layer;

b) a buffer step to slow the etch rate of said conductive layer, wherein a plasma source power or a substrate bias power or both are reduced or discontinued; and c) a second etchback step to remove residues of said conductive layer from an upper surface of said substrate without significant additional etching of conductive layer material residing within said contact hole.

2. The method of claim 1, wherein said conductive layer comprises a metal.

3. The method of claim 2, wherein said conductive layer comprises tungsten.

4. The method of claim 1, wherein said conductive layer comprises a metal selected from the group consisting of aluminum, aluminum-copper, aluminum-copper-silicon, and aluminum-silicon.

5. The method of claim 1, or claim 2, or claim 3, or claim 4, wherein said semiconductor structure further includes a diffusion barrier layer underlying said conductive material layer, and a wetting layer between said diffusion barrier layer and said dielectric layer.

6. The method of claim 1 including an additional step:

d) depositing a second conductive material over said substrate surface subsequent to said second etch back.

7. The method of claim 6, wherein said conductive layer comprises tungsten and wherein said second conductive material comprises a metal selected from the group consisting of aluminum, aluminum-copper, aluminum-copper-silicon, and aluminum silicon.

8. The method of claim 5, wherein said diffusion barrier layer comprises titanium nitride, and said wetting layer comprises titanium.

9. The method of claim 1, wherein said conductive layer deposited in said contact hole forms an electrically conductive connection between said conductive region underlying said dielectric layer and said conductive layer deposited over said substrate surface.

10. The method of claim 9, wherein said first etch step is a plasma etch.

11. The method of claim 10, wherein a source gas used to form said plasma comprises fluorine.

12. The method of claim 11, wherein said source gas comprises $SF_6$.

13. The method of claim 12, wherein said source gas further comprises argon.

14. The method of claim 12 or claim 13, wherein said source gas further comprises nitrogen.

15. The method of claim 11 or claim 12 or claim 13, wherein said source gas further comprises oxygen.

16. The method of claim 14, wherein said source gas further comprises oxygen.

17. The method of claim 1, wherein said buffer step is performed using a substrate bias power which is 50% or less than a substrate bias power used in said first etchback, and wherein the temperature of said substrate is reduced.

18. The method of claim 1, wherein said buffer step is performed by discontinuing a plasma source power and a substrate bias power used in said first etchback, and wherein the temperature of said substrate is reduced.

19. The method of claim 17 or claim 18, whereby the temperature of said substrate is reduced by at least 10° C. during said buffer step.

20. The method of claim 1, wherein said second etchback is a plasma etch.

21. The method of claim 20, wherein said second etchback is performed at a substrate temperature that is at least 10° C. less than the substrate temperature during the performance of the first etchback.

22. The method of claim 20, wherein the argon content of a source gas used to create said plasma in said second etchback is greater than the argon content of a source gas used to create said plasma in said first etch back.

23. The method of claim 22, wherein a flow rate of argon used to create said plasma in said second etchback is about two times greater than a flow rate of argon used to create said plasma in said first etch back.

24. The method of claim 20, wherein the fluorine content of a source gas used to create said plasma in said second etchback is less than the fluorine content of a source gas used to create said plasma in said first etch back.

25. The method of claim 24, wherein the flow rate of a fluorine-comprising gas used to create said plasma in said second etchback is about 50% of a flow rate of a fluorine-comprising gas used to create said plasma in said first etch back.

* * * * *